United States Patent
Su et al.

(10) Patent No.: US 12,514,027 B2
(45) Date of Patent: Dec. 30, 2025

(54) SEMICONDUCTOR PHOTO-DETECTING DEVICE

(71) Applicant: EPISTAR CORPORATION, Hsinchu (TW)

(72) Inventors: Chu-Jih Su, Hsinchu (TW);
Chia-Hsiang Chou, Hsinchu (TW);
Wei-Chih Peng, Hsinchu (TW);
Wen-Luh Liao, Hsinchu (TW);
Chao-Shun Huang, Hsinchu (TW);
Hsuan-Le Lin, Hsinchu (TW);
Shih-Chang Lee, Hsinchu (TW); Mei Chun Liu, Hsinchu (TW); Chen Ou, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 18/608,216

(22) Filed: Mar. 18, 2024

(65) Prior Publication Data

US 2024/0222538 A1     Jul. 4, 2024

Related U.S. Application Data

(63) Continuation of application No. 17/364,175, filed on Jun. 30, 2021, now Pat. No. 11,935,981, which is a
(Continued)

(51) Int. Cl.
*H10F 77/45*     (2025.01)
*H01L 25/16*     (2023.01)
(Continued)

(52) U.S. Cl.
CPC ............ *H10F 77/45* (2025.01); *H01L 25/167* (2013.01); *H10F 30/21* (2025.01); *H10F 55/18* (2025.01);
(Continued)

(58) Field of Classification Search
CPC .. H10F 77/1248; H10F 55/25; H10F 30/2215; H10F 77/933
See application file for complete search history.

(56) References Cited

U.S. PATENT DOCUMENTS

| | | |
|---|---|---|
| 5,471,076 A | 11/1995 | Murakami et al. |
| 5,880,489 A | 3/1999 | Funaba et al. |
| 2020/0313022 A1 | 10/2020 | Sim |

FOREIGN PATENT DOCUMENTS

| | | |
|---|---|---|
| CN | 106784118 A | 5/2017 |
| CN | 112259626 A | 1/2021 |

(Continued)

*Primary Examiner* — Matthew L Reames
(74) *Attorney, Agent, or Firm* — Muncy, Geissler, Olds & Lowe, P.C.

(57) ABSTRACT

A photo-detecting device includes a first semiconductor layer, a second semiconductor layer located on the first semiconductor layer, a light-absorbing layer located between the first semiconductor layer and the second semiconductor layer, an insulating layer located on the second semiconductor layer, and an electrode structure located on the insulating layer. The second semiconductor layer includes a first region having a first conductivity-type and a second region having a second conductivity-type different from the first conductivity-type. The first region is surrounded by the second region, and includes a geometric center and an interface between the first region and the second region. The insulating layer covers the first region and the second region. The electrode structure includes an outer sidewall located on the second region. In a top view, the interface is located between the geometric center and the outer sidewall.

20 Claims, 4 Drawing Sheets

Related U.S. Application Data continuation-in-part of application No. 16/917,223, filed on Jun. 30, 2020, now Pat. No. 11,335,826.

(51) Int. Cl.
*H10F 30/21* (2025.01)
*H10F 55/00* (2025.01)
*H10F 77/124* (2025.01)
*H10F 77/20* (2025.01)

(52) U.S. Cl.
CPC ....... *H10F 77/1248* (2025.01); *H10F 77/206* (2025.01)

(56) References Cited

FOREIGN PATENT DOCUMENTS

| | | |
|---|---|---|
| JP | 2006-032567 A | 2/2006 |
| TW | 202036881 A | 10/2020 |

SEMICONDUCTOR PHOTO-DETECTING DEVICE

CROSS REFERENCE TO RELATED APPLICATION

This application is a continuation application of U.S. Pat. No. 17/364,175 entitled "SEMICONDUCTOR PHOTO-DETECTING DEVICE", filed on Jun. 30, 2021, which claims the right of priority based on U.S. application Ser. No. 16/917,223, filed on Jun. 30, 2020, and the content of which is hereby incorporated by reference in its entirety.

FIELD OF DISCLOSURE

The present disclosure relates to a semiconductor photo-detecting device, and particularly to a semiconductor photo-detecting device with p-i-n structure.

BACKGROUND OF THE DISCLOSURE

The descriptions herein merely provide background information related to the present disclosure and do not necessarily constitute prior arts. A semiconductor optoelectronic device mainly involves the conversion between light and electricity. A light-emitting device, such as a light-emitting diode (LED) or a laser diode (LD), can convert electricity to light, and a light-absorbing device, such as a photovoltaic cell (PVC) or a photo-detecting device (PD), can convert light to electricity. LEDs have been widely applied to illumination and light sources of various electronic devices, and LDs have also been applied to projectors and proximity sensors extensively. PVCs can be applied to power plants and power generation centers for use in space and PDs can be applied to fields of light sensing and communication.

SUMMARY OF THE DISCLOSURE

The present disclosure provides a photo-detecting device. The photo-detecting device includes a first semiconductor layer, a second semiconductor layer located on the first semiconductor layer, a light-absorbing layer located between the first semiconductor layer and the second semiconductor layer, an insulating layer located on the second semiconductor layer, and an electrode structure located on the insulating layer. The second semiconductor layer includes a first region having a first conductivity-type and a second region having a second conductivity-type different from the first conductivity-type. The first region is surrounded by the second region, and includes a geometric center and an interface between the first region and the second region. The insulating layer covers the first region and the second region. The electrode structure includes an outer sidewall located on the second region. In a top view, the interface is located between the geometric center and the outer sidewall.

The present disclosure further provides a photo-detecting module. The photo-detecting module includes a light-emitting device, the photo-detecting device, and a carrier electrically connecting to the light-emitting device and the photo-detecting device.

DETAILED DESCRIPTION OF THE DISCLOSURE

Figure 1:
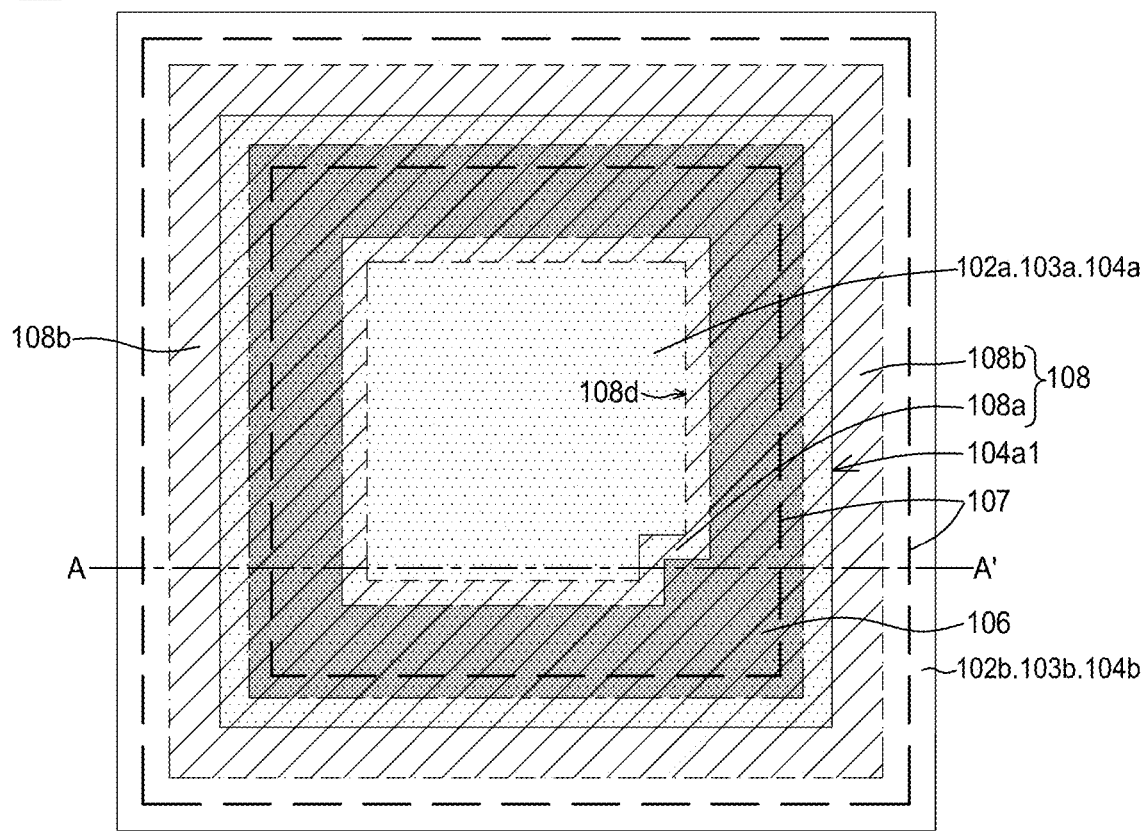
FIG. 1 shows a photo-detecting device and a cross-section along the A-A' line in accordance with an embodiment of the present disclosure.
Figure 1:
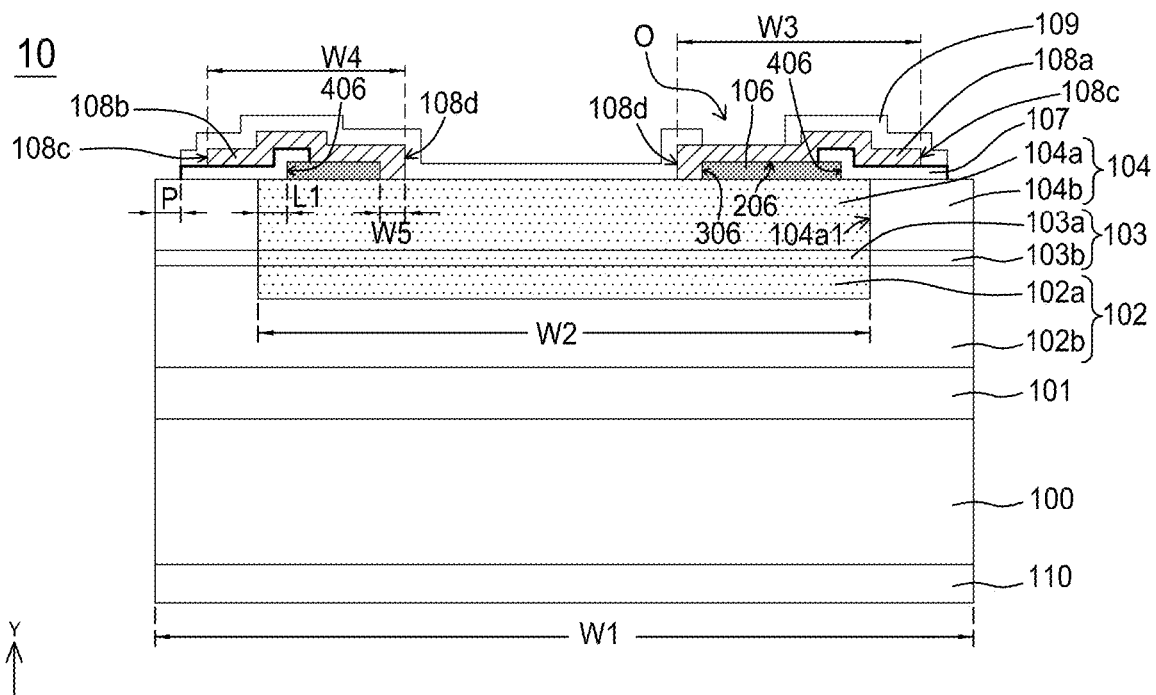

The embodiments of the present disclosure will be described in detail below with reference to the drawings. In the descriptions of the specification, specific details are provided for a full understanding of the present disclosure. The same or similar elements in the drawings will be denoted by the same or similar symbols. It is noted that the drawings are for illustrative purposes only and do not represent the actual dimensions or quantities of the elements. Some of the details may not be fully sketched for the conciseness of the drawings.

FIG. 1 shows a photo-detecting device in accordance with an embodiment of the present disclosure wherein the upper part of FIG. 1 shows a top view of a photo-detecting device 10, and the lower part of FIG. 1 shows a cross-sectional view taken along cross-section line A-A'. As shown in the lower part of FIG. 1, the photo-detecting device 10 includes a substrate 100, a first semiconductor layer 101, a second semiconductor layer 104, a light-absorbing layer 102, a semiconductor contact layer 106, an insulating layer 107, and a first electrode structure 108. The first semiconductor layer 101 is located on the substrate 100. The second semiconductor layer 104 is located on the first semiconductor layer 101. The light-absorbing layer 102 is located between the first semiconductor layer 101 and the second semiconductor layer 104. The semiconductor contact layer 106 can be patterned and facilitate the ohmic contact formation between metal and semiconductor, which is located on the second semiconductor layer 104. The insulating layer 107 covers the semiconductor contact layer 106 and the second semiconductor layer 104. The first electrode structure 108 includes an electrode pad 108a and an extension electrode 108b. The first electrode structure 108 covers the semiconductor contact layer 106 and the second semiconductor layer 104. The photo-detecting device 10 can further include an anti-reflection layer 109 located on the second semiconductor layer 104. The anti-reflection layer 109 can cover the first electrode structure 108 and the insulating layer 107. In an embodiment, the photo-detecting device 10 further includes a second electrode structure 110 located on the bottom of the substrate 100.

The first semiconductor layer 101 includes a first dopant and has the first conductivity-type. The second semiconductor layer 104 includes a second dopant and a third dopant. The first dopant, the second dopant, and the third dopant may be different from each other. The second semiconductor layer 104 includes the second dopant such that the second semiconductor layer 104 is first conductivity-type; while in another embodiment, the second semiconductor layer 104 includes the third dopant such that the second semiconductor layer 104 is second conductivity-type different from the first conductivity-type. In an embodiment, the second semiconductor layer 104 includes a first region 104a and a second region 104b. The first region 104a includes a second dopant and a third dopant, wherein the doping concentration of the third dopant is higher than that of the second dopant such that the first region 104a of the second semiconductor layer 104 has a second conductivity-type. The first conductivity-type is different from the second conductivity-type. The second region 104b includes the second dopant without the third dopant such that the second region 104b of the second semiconductor layer 104 has the first conductivity-type. An interface between the first region 104a and the second region 104b can be observed by Atomic Force Microscope (AFM) because the second region 104b does not have the third dopant. For example, the interface can be shown in FIG. 1 as a perimeter 104a1 of the first region 104a.

In a top view of the photo-detecting device 10, as shown in the upper part of FIG. 1, the second region 104b surrounds the first region 104a. In a cross-sectional view of the photo-detecting device 10, as shown in the lower part of FIG. 1, the substrate 100, the first semiconductor layer 101, the light-absorbing layer 102, or the second semiconductor layer 104 can have the same first width W1. The first region 104a has a second width W2 smaller than the first width W1. In a top view of the photo-detecting device 10, as shown in the upper and lower parts of FIG. 1, the first region 104a includes an exposed portion which is not covered by the semiconductor contact layer 106, the insulating layer 107, and the first electrode structure 108. In an embodiment, the exposed portion has a surface area which is 60% to 90% of the total surface area of the first region 104a. The exposed portion of the first region 104a can be covered by or physically contact with the anti-reflection layer 109.

In the embodiment, a portion of the second region 104b is not covered by the semiconductor contact layer 106, the insulating layer 107, the first electrode structure 108, and the anti-reflection layer 109. In some embodiments, the uncovered portion of the second region 104b may benefit the progress of a subsequent fabrication process such as a dicing process. In an embodiment, the uncovered portion has a path width P greater than or equal to 10 μm and smaller than or equal to 100 μm, such as 20 μm, 30 μm, 40 μm, or 50 μm. The semiconductor contact layer 106 is located on the first region 104a of the second semiconductor layer 104. The semiconductor contact layer 106 includes the second dopant and the third dopant. The semiconductor contact layer 106 includes the second dopant such that the semiconductor contact layer 106 is first conductivity-type; while in another embodiment, the semiconductor contact layer 106 includes third dopant such that the semiconductor contact layer 106 is second conductivity-type. The concentration of the third dopant in the semiconductor contact layer 106 is greater than the concentration of the second dopant in the semiconductor contact layer 106, such that the semiconductor contact layer 106 has the second conductivity-type. The insulating layer 107 covers the semiconductor contact layer 106, the first region 104a, and the second region 104b of the second semiconductor layer 104. The first electrode structure 108 covers the semiconductor contact layer 106, the first region 104a, and the second region 104b of the second semiconductor 104.

In a cross-sectional view of the photo-detecting device 10, as shown in the lower part of FIG. 1, the semiconductor contact layer 106, the insulating layer 107, and the first electrode structure 108 are sequentially stacked along a vertical direction (Y-axis). The first electrode structure 108, the semiconductor contact layer 106, and the insulating layer 107 are sequentially disposed on the same plane along the horizontal direction (X-axis). The semiconductor contact layer 106 includes an upper surface 206, a first side surface 306, and a second side surface 406 on the opposite side to the first side surface 306. The first electrode structure 108 can cover and physically contact a portion of the upper surface 206 and the first side surface 306, thus a low resistance interface (e.g. an ohmic contact) can be obtained between the semiconductor contact layer 106 and the first electrode structure 108. The insulating layer 107 can cover and physically contact another portion of the top surface 206 and the second side surface 406 of the semiconductor contact layer 106. Specifically, in a cross-sectional view of the photo-detecting device 10, the semiconductor contact layer 106 physically contacts the first region 104a and is separated from the second region 104b such that a current leakage path between the semiconductor contact layer 106 and the second region 104b can be prevented from being formed. In an embodiment, the second side surface 406 of the semiconductor contact layer 106 is separated from a perimeter 104a1 of first region 104a in the horizontal direction by a first distance L1 which is greater than or equal to 1 μm and is smaller than or equal to 20 μm, such as 5 μm, 10 μm, or 15 μm. In an embodiment, the first electrode structure 108 covers a portion of the upper surface 206 and the second side surface 406 instead of covering the first side surface 306. Therefore, the covered area of the first region 104a by the first electrode structure 108, the semiconductor contact layer 106, and the insulating layer 107 can be reduced to raise the photocurrent.

In the embodiment, the first electrode structure 108 includes the electrode pad 108a and the extension electrode 108b extending from the electrode pad 108a. The electrode pad 108a can connect to a power supply or other devices by an external wire. In an embodiment, the anti-reflection layer 109 has an opening O on the electrode pad 108a so that the electrode pad 108a can physically connect to the external wire through the opening O. In the horizontal direction, the electrode pad 108a has a third width W3, the extension electrode 108b has a fourth width W4, and the fourth width W4 is smaller than the third width W3. In an embodiment, the third width W3 is greater than or equal to 50 μm and is smaller than or equal to 200 μm, such as 100 μm or 150 μm. The fourth width W4 is greater than or equal to 10 μm and is smaller than or equal to 50 μm, such as 20 μm, 30 μm, or 40 μm. The width of the opening O is greater than or equal to 50 μm and is smaller than or equal to 100 μm, such as 60 μm, or 80 μm. The first electrode structure 108 includes a portion physically contacting with the first region 104a, the aforementioned portion has a fifth width W5 which is between 1 μm and 50 μm, such as 5 μm, 10 μm, 20 μm, 30 μm, or 40 μm.

In the top view of the photo-detecting device 10, as shown in the upper part of FIG. 1, the first region 104a is a rectangle. The semiconductor contact layer 106 forms a first shape such as an annulus (square annulus or circle annulus) along the perimeter 104a1 of the first region 104a, in this way, the semiconductor contact layer 106 can provide the electrical ohmic contact between the first region 104a and the electrode structure 108 and also exposes sufficient the first region 104a area for light detecting. The extension electrode 108b extends from the electrode pad 108a and forms a second shape such as an annulus (square annulus or circle annulus) along the perimeter 104a1 of the first region 104a. The insulating layer 107 forms a third shape such as an annulus (square annulus or circle annulus) along the perimeter 104a1 of the first region 104a. In an embodiment, the first shape, the second shape, and the third shape have the same geometric center. The electrode structure 108 has an outer sidewall 108c and an inner sidewall 108d, and the first region 104a is the region enclosed by the projection of the outer sidewall 108c, namely, the perimeter 104a1 of the first region 104a is closer to the center of the photo-detecting device 10 than the outer sidewall 108c of the electrode structure 108 in a horizontal direction. In an embodiment, the first electrode structure 108 covers an edge portion of the first region 104a in the top view of the photo-detecting device 10, and 60% to 90% of the total surface area of the first region 104a is not covered by the first electrode structure 108.

In an embodiment of the present disclosure, the photo-detecting device 10 further includes a diffusion barrier layer 103 between the second semiconductor layer 104 and the light-absorbing layer 102. The diffusion barrier layer 103 includes a third region 103a and a fourth region 103b. Similarly, the diffusion barrier layer 103 includes the third dopant such that the diffusion barrier layer 103 is second conductivity-type; while in another embodiment, the diffusion barrier layer 103 includes the second dopant such that the diffusion barrier layer 103 is first conductivity-type. The third region 103a includes the second dopant and the third dopant. In an embodiment, the doping concentration of the third dopant can be higher than that of the second dopant in the third region 103a, such that the third region 103a of the diffusion barrier layer 103 has the second conductivity-type. The fourth region 103b includes the second dopant and does not include the third dopant, such that the fourth region 103b of the diffusion barrier layer 103 has the first conductivity-type.

In the top view of the photo-detecting device 10, as shown in the upper part of FIG. 1, the fourth region 103b surrounds the third region 103a. In the cross-sectional view of the photo-detecting device 10, as shown in the lower part of FIG. 1, the third region 103a includes an exposed portion which is not covered by the semiconductor contact layer 106, the insulating layer 107, and the first electrode structure 108. In an embodiment, the exposed portion has a surface area which is 60% to 90% of a total surface area of the third region 103a. The configuration, the thickness and the material selection of the diffusion barrier layer 103 can control the diffusion of the third dopant during the fabrication process of the photo-detecting device 10. For example, the concentration and the diffusion depth of the third dopant in the light-absorbing layer 102 may be adjusted by the presence of the diffusion barrier layer 103. Specifically, the thickness and the material of the diffusion barrier layer 103 contribute to the concentration and the diffusion depth of the third dopant in the light-absorbing layer 102. In an embodiment, when the diffusion rate of the third dopant in the diffusion barrier layer 103 is slower than that in the second semiconductor layer 104, in other words, the diffusion coefficient of the third dopant in the diffusion barrier layer 103 is smaller than that of in the second semiconductor layer 104, the diffusion barrier layer 103 with smaller thickness can make the concentration and the diffusion depth of the third dopant in the light-absorbing layer 102 reach the predetermined condition.

The light-absorbing layer 102 can convert the light into electricity and has a specific energy band gap (Eg1) corresponding to a specific wavelength (λ1). Therefore, the light-absorbing layer 102 is capable of absorbing the light having an energy greater than or equal to Eg1 or the light having a wavelength smaller than or equal to λ1, and further generating an electrical signal, such as current or voltage. In one embodiment, the first semiconductor layer 101 and the second semiconductor layer 104 have the energy band gap greater than the energy band gap (Eg1) of the light-absorbing layer 102. In an embodiment, the first region 104a of the second semiconductor layer 104, the light-absorbing layer 102, and the first semiconductor layer 101 can form a p-i-n structure of the photo-detecting device. The first region 104a of the second semiconductor layer 104 and the first semiconductor layer 101 with different conductivity-types directly or indirectly connect to two surfaces of the light-absorbing layer 102 and form a depletion region in the light-absorbing layer 102 to improve light absorption.

In the embodiment, the light-absorbing layer 102 includes a fifth region 102a and a sixth region 102b. The light-absorbing layer 102 includes the third dopant which has the second conductivity-type. To be more specific, the fifth region 102a includes the third dopant such that the fifth region 102a is the second conductivity-type while the sixth region 102b does not include the third dopant. In an embodiment, the sixth region 102b can be undoped, thus the sixth region 102b is neither the first conductivity-type nor the second conductivity-type. In another embodiment, the sixth region 102b can be unintentionally-doped and has the first conductivity-type or the second conductivity-type. In a cross-sectional view of the photo-detecting device 10, as shown in the lower part of FIG. 1, the sixth region 102b surrounds the fifth region 102a which has a width same as the second width W2. In the cross-sectional view of the photo-detecting device 10, as shown in the lower part of FIG. 1, the fifth region 102a includes an exposed portion which is not covered by the semiconductor contact layer 106, the insulating layer 107, and the first electrode structure 108. In an embodiment, the exposed portion has a surface area which is 60% to 90% of a total surface area of the fifth region 102a.

In an embodiment, in the cross-sectional view of the photo-detecting device 10, as shown in the lower part of FIG. 1, the first region 104a of the second semiconductor layer 104, the third region 103a of the diffusion barrier layer 103, and the fifth region 102a of the light-absorbing layer 102 are formed by the diffusion process of the third dopant. The first region 104a of the second semiconductor layer 104, the third region 103a of the diffusion barrier layer 103, and the fifth region 102a of the light-absorbing layer 102 can have the same surface area. In other words, the first region 104a, the third region 103a, and the fifth region 102a can be completely overlapped in a vertical direction. In a cross-sectional view of the photo-detecting device 10, as shown in the lower part of FIG. 1, the thickness of the first region 104a is equal to that of the second region 104b, the thickness of the third region 103a is equal to that of the fourth region 103b, and the thickness of the fifth region 102a is smaller than that of the sixth region 102b. The thickness of the fifth region 102a of the light-absorbing layer 102 may be greater than or equal to 0.5 μm, and smaller than or equal to 3 μm, for example, 1 μm, 1.5 μm, 2 μm, or 2.5 μm. By the presence of the fifth region 102a of the light-absorbing layer 102, the signal-to-noise ratio (S/N) of the photo-detecting device 10 can be improved.

The third dopant has a first doping concentration in the semiconductor contact layer 106, a second doping concentration in the first region 104a of the second semiconductor 104, a third doping concentration in the third region 103a of the diffusion layer 103, and a fourth doping concentration in the fifth region 102a of the light-absorbing layer 102. In an embodiment, the first, second, and third doping concentrations can be roughly the same, e.g. in a range of $10^{18}$ to $10^{19}$ cm$^{-3}$. The fourth doping concentration can be lower than any one of the first, second, and third doping concentrations, e.g. in a range of $10^{16}$ to $10^{19}$ cm$^{-3}$.

Figure 2:
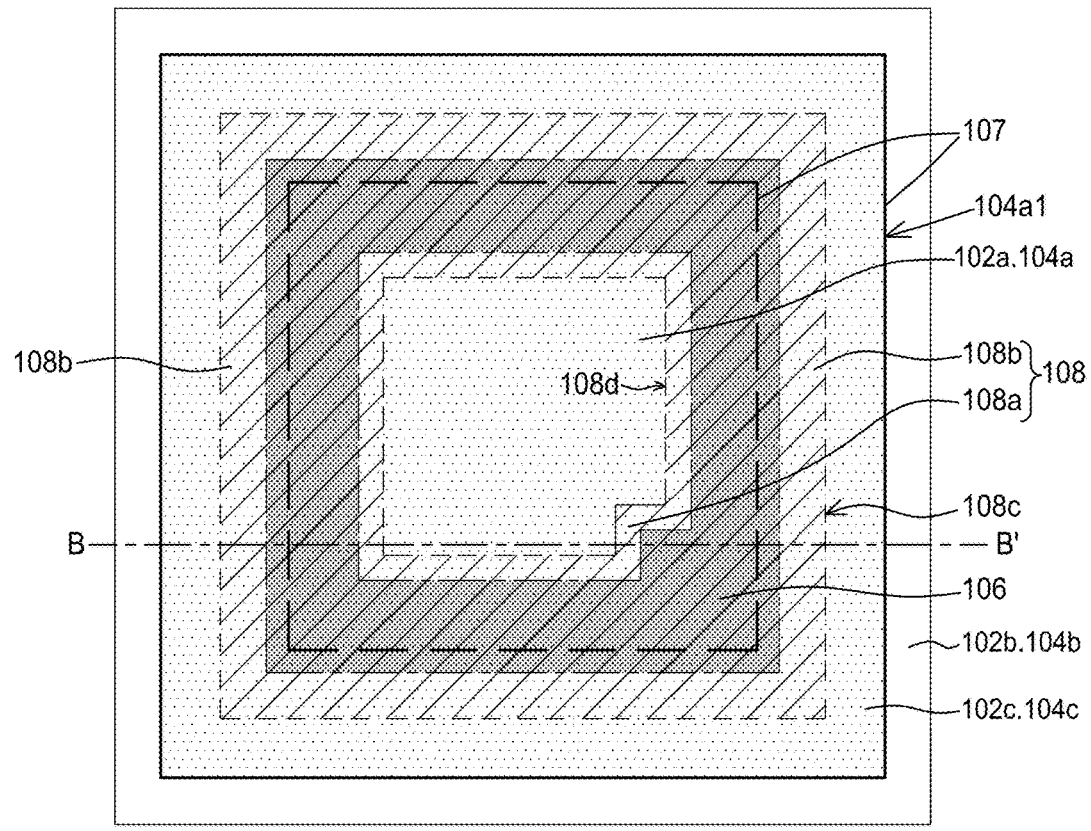
FIG. 2 shows a photo-detecting device and a cross-section along the B-B' line in accordance with an embodiment of the present disclosure.
Figure 2:
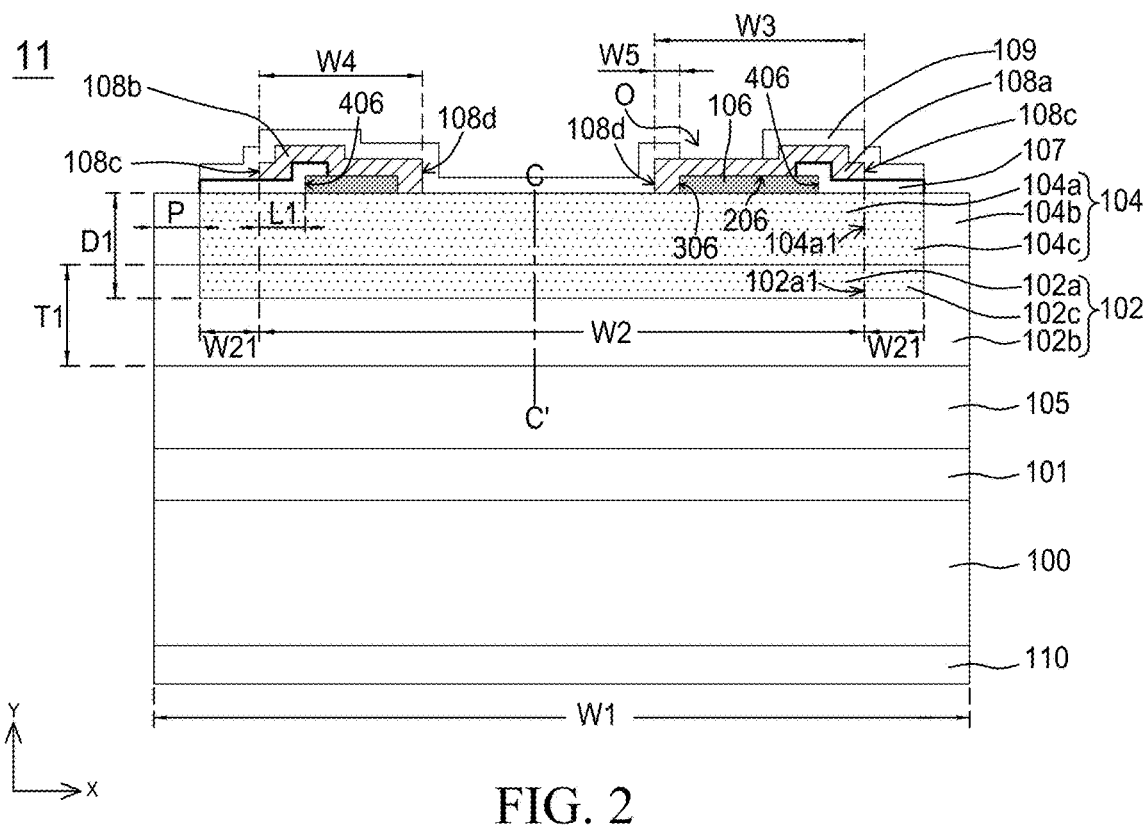

FIG. 2 shows a photo-detecting device in accordance with an embodiment of the present disclosure wherein the upper part of FIG. 2 shows a top view of a photo-detecting device 11 and the lower part of FIG. 2 shows a cross-sectional view taken along cross-section line B-B'. The photo-detecting device 11 can include similar elements in the photo-detecting device 10. In a photo-detecting device manufacturing process, the diffusion process is performed after the epitaxy process so the semiconductor structure grown in the epitaxy process affect the dopant which is required to penetrate through multiple semiconductor layers, for example, contact layer and cap layer, and reach the light light-absorbing layer in the diffusion process. In this embodiment, the thickness of the semiconductor contact layer 106 is greater than or equal to 50 Å and is smaller than or equal to 1000 Å, such as 100 Å, 200 Å, 300 Å, 400 Å, 500 Å, 600 Å, 700 Å, 800 Å, or 900 Å. As the semiconductor contact layer 106 has a thickness smaller than or equal to 1000 Å, the controllability for the third dopant diffusion process may be enhanced, and the dark current contributed by the defect of the photo-detecting device 11 is decreased. Furthermore, the fabrication yield of photo-detecting devices 11 is increased.

As shown in the upper part of FIG. 2, after projecting the photo-detecting device 11 to a horizontal plane, the first electrode structure 108 can form an annulus, such as circle annulus or square annulus. In another embodiment, in the vertical direction, the perimeter 104a1 of the first region 104a can be aligned with the outer sidewall 108c of the first electrode structure 108. The second semiconductor layer 104 of the photo-detecting device 11 can include a seventh region 104c. The seventh region 104c includes the second dopant and the third dopant. The third dopant diffuses from the first region 104a and crosses beyond the outer sidewall 108c of the first electrode structure 108 to form the seventh region 104c in the horizontal direction. As shown in the lower part of FIG. 2, the seventh region 104c is not covered by the semiconductor contact layer 106 and the first electrode structure 108. Instead, the seventh region 104c is covered by the insulating layer 107. In an embodiment, there is a first distance L1 between the second side surface 406 of the semiconductor contact layer 106 and the seventh region 104c of the second semiconductor layer 104 in the horizontal direction. The first distance L1 is greater than or equal to 1 μm and is smaller than or equal to 20 μm, such as 5 μm, 10 μm, or 15 μm. In an embodiment, the doping concentration of the third dopant can be higher than that of the second dopant in the seventh region 104c, such that the seventh region 104c of the second semiconductor layer 104 has the second conductivity-type.

In the top view of the photo-detecting device 11, as shown in the upper part of FIG. 2. The seventh region 104c surrounds the first region 104a, and the second region 104b surrounds the seventh region 104c. The seventh region 104c is between the first region 104a and the second region 104b in the horizontal direction. Between the first region 104a and the seventh region 104c, there is no interface can be observed by Atomic Force Microscope (AFM) because the first region 104a and the seventh region 104c both have the second dopant and the third dopant. On the contrary, an interface between the second region 104b and the seventh region 104c can be observed by AFM because the second region 104b does not have the third dopant.

As shown in the upper part of FIG. 2, the light-absorbing layer 102 of the photo-detecting device 11 includes an eighth region 102c. The eighth region 102c includes the third dopant. Thus, the eighth region 102c of the light-absorbing layer 102 has the second conductivity-type. The eighth region 102c surrounds the fifth region 102a, the sixth region 102b surrounds the eighth region 102c, and the eighth region 102c is between the fifth region 102a and the sixth region 102b in the horizontal direction.

As shown in the lower part of FIG. 2, in a vertical direction, the fifth region 102a of the light-absorbing layer 102 is enclosed by the projection of the outer sidewall 108c of the first electrode structure 108 and the perimeter 102a1 of the fifth region 102a is aligned with the outer sidewall 108c of the first electrode structure 108. The third dopant diffuses from the fifth region 102a and crosses beyond the outer sidewall 108c of the first electrode structure 108 to form the eighth region 102c of the light-absorbing layer 102 in the horizontal direction. Thus, the eighth region 102c is not covered by the first electrode structure 108 and the semiconductor contact layer 106. Instead, the eighth region 102c is covered by the insulating layer 107.

The lower part of FIG. 2 shows a cross-sectional view of the photo-detecting device 11. The thickness of the seventh region 104c is the same with the first region 104a and/or the second region 104b thereof. The thickness of the eighth region 102c is the same with the fifth region 102a and is smaller than the thickness of the sixth region 102b. The thickness T1 of the light-absorbing layer 102 is greater than or equal to 1 μm, and is smaller than or equal to 5 μm. The thickness of the eighth region 102c is greater than or equal to 0.1 μm, and is smaller than or equal to 1 μm, such as 0.2 μm, 0.4 μm, 0.6 μm, or 0.8 μm. The thickness of the sixth region 102b may be as large as the thickness T1 of the light-absorbing layer 102.

In an embodiment, the photo-detecting device 11 can optionally include the diffusion barrier layer (not shown), which can be referred to FIG. 1, located between the second semiconductor layer 104 and the light-absorbing layer 102 in the vertical direction. The diffusion barrier layer can include a ninth region (not shown) surrounding the third region 103a referred to the FIG. 1 in the horizontal direction. The ninth region includes the second dopant and the third dopant. The doping concentration of the third dopant can be higher than that of the second dopant in the ninth region such that the ninth region of the diffusion barrier layer 103 has the second conductivity-type.

In the top view of the photo-detecting device 11, as shown in the upper part of FIG. 2, the fourth region (not shown), which can be referred to the fourth region 103b shown in FIG. 1, surrounds the ninth region. The ninth region is between the third region and the fourth region in the horizontal direction. In the vertical direction, the perimeter of the third region (not shown) may be aligned with the outer sidewall 108c of the first electrode structure 108. The third dopant diffuses from the third region and cross beyond the outer sidewall 108c of the first electrode structure 108 to form the ninth region of the diffusion barrier layer in the horizontal direction. Thus, the ninth region is not covered by the first electrode structure 108 and the semiconductor contact layer 106. Instead, the ninth region is covered by the insulating layer 107.

In an embodiment, the seventh region 104c (or the first region 104a) and the eighth region 102c (or the fifth region 102a) stack sequentially along the vertical direction. The stacked seventh region 104c (or the first region 104a) and eighth region 102c (or the fifth region 102a) have a depth D1, which is the diffusion depth of the third dopant. In an embodiment including the diffusion barrier layer, the depth D1 is constituted by the stack including the seventh region 104c (or the first region 104a), eighth region 102c (or the fifth region 102a), and the ninth region (or the third region).

The depth D1 is greater than or equal to 2 μm and is smaller than or equal to 4 μm, such as 2.5 μm, 3 μm, or 3.5 μm. The seventh region 104c and the eighth region 102c form an outer ring having a width W21. The width W21 is greater than or equal to 2 μm and is smaller than or equal to 3 μm, such as 2.5 μm. In an embodiment, the ratio of the depth D1 to the width W21 is greater than 0.67 and smaller than 2, such as 1, 1.1, 1.2, 1.3, 1.4, 1.5, 1.6, 1.7, 1.8, or 1.9.

In an embodiment, the photo-detecting device 11 includes an interlayer 105 between the light-absorbing layer 102 and the first semiconductor layer 101. The interlayer 105 includes undoped or unintentionally-doped semiconductor with the energy band gap $Eg_1$ greater than the energy band gap Eg of the light-absorbing layer 102. The interlayer 105 has a width which is same with the first width W1 of the substrate 100, the first semiconductor layer 101, the light-absorbing layer 102, and the second semiconductor layer 104. The interlayer 105 has a thickness greater than or equal to 0.5 μm and is smaller than or equal to 3 μm, such as 1 μm, 1.5 μm, 2 μm, or 2.5 μm. With the interlayer 105, the dark current and the capacitance of the photo-detecting device 11 can be reduced.

Figure 3:
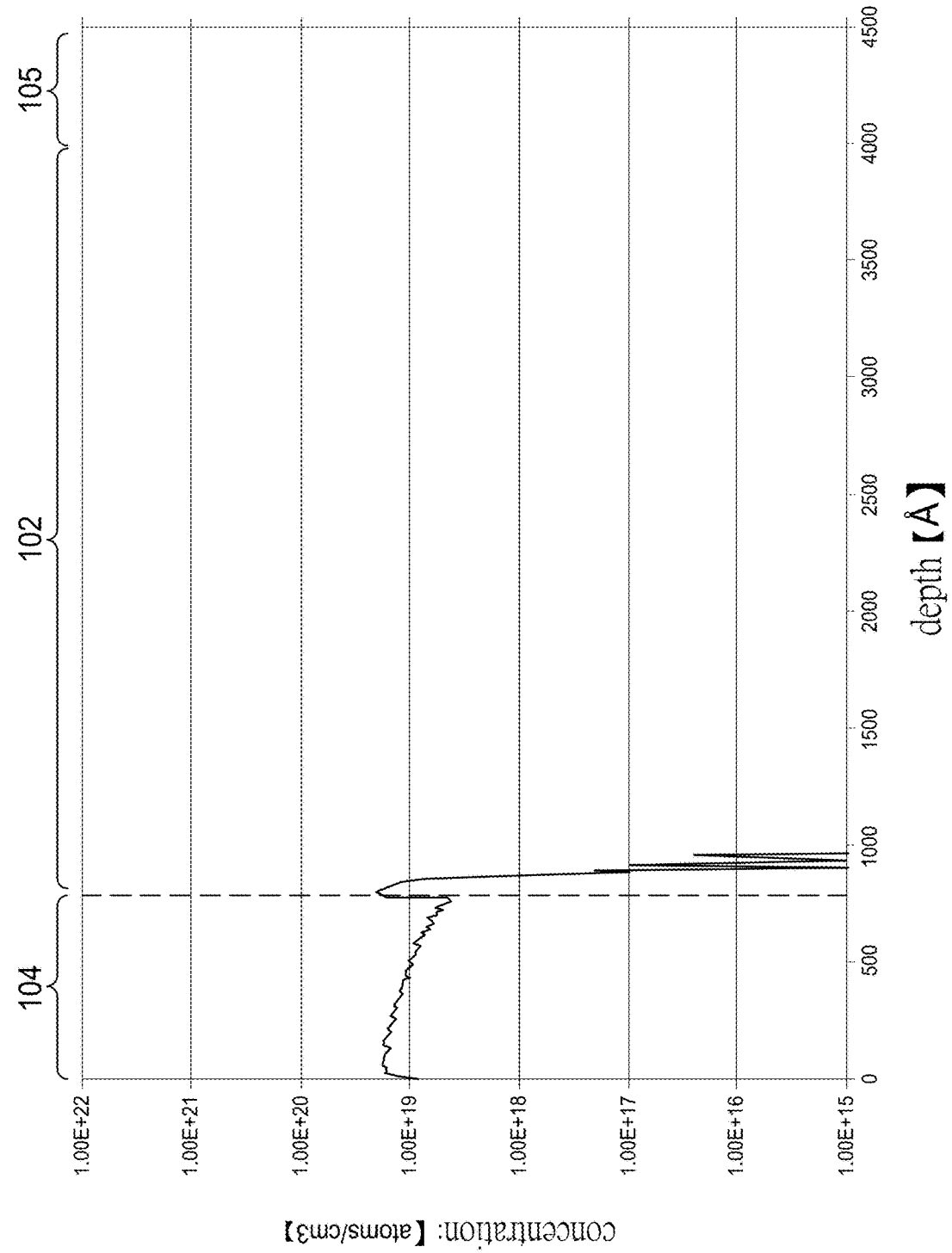
FIG. 3 shows a spectrum of Secondary Ion Mass Spectrometry of the embodiment showed in FIG. 2 along the C-C' line.

FIG. 3 shows Secondary Ion Mass Spectroscopy (SIMS) spectrum of an embodiment of the photo-detecting device 11 without diffusion barrier layer 103 along the C-C' line in FIG. 2. In FIG. 3, from the left side to the right side, it can be separated into three regions representing the third dopant concentration of the second semiconductor layer 104, the light-absorbing layer 102, and interlayer 105 respectively. When the thickness of the semiconductor contact layer 106 is greater than or equal to 50 Å, and is smaller than or equal to 1000 Å, the third dopant can properly diffuse into the light-absorbing layer 102 from the second semiconductor layer 104. The third dopant can diffuse underneath the interface of the second semiconductor layer 104 and the light-absorbing layer 102 at a depth, which is greater than or equal to 0.1 μm, and smaller than or equal to 1 μm, such as 0.2 μm, 0.4 μm, 0.6 μm, or 0.8 μm. In an embodiment, the element showed in FIG. 3 is the third dopant. In FIG. 3, along the direction from the second semiconductor layer 104 to the interlayer 105, the third dopant concentration in the second semiconductor layer 104 decreases from an order of $10^9$ cm$^{-3}$ to an order of $10^{18}$ cm$^{-3}$, and there is an order of $10^{19}$ cm$^{-3}$ cm at the interface of the second semiconductor layer 104 and the light-absorbing layer 102. The decreased gradient rate of the third dopant in the second semiconductor layer 104 is around $10^{16} \sim 10^{17}$ cm$^{-3}$·nm$^{-1}$. Along the direction from the light-absorbing layer 102 to the interlayer 105, the concentration of the third dopant decreases from the order of $10^{19}$ cm$^{-3}$ in the light-absorbing layer 102 to the order of $10^{17}$ cm$^{-3}$ steeply, and the decreased gradient rate of the third dopant is $10^{16} \sim 10^{19}$ cm$^{-3}$·nm$^{-1}$. In an embodiment, the decreased gradient rate of the third dopant in the light-absorbing layer 102 is greater than the decreased gradient rate of the third dopant in the second semiconductor layer 104. In other words, the diffusion coefficient of the third dopant in the second semiconductor layer 104 is greater than the diffusion coefficient of the third dopant in the light-absorbing layer 102, for example, the diffusion coefficient of the third dopant in the second semiconductor layer 104 can be greater than $10^{-14}$ cm$^2$/s and smaller than $10^{-13}$ cm$^2$/s, and the diffusion coefficient of the third dopant in the light-absorbing layer 102 can be in the range of $10^{-14}$ cm$^2$/s and $10^{-16}$ cm$^2$/s.

In an embodiment with the diffusion barrier layer, the third dopant concentration along the direction from the second semiconductor layer 104 to the interlayer 105 decreases from an order of $10^{19}$ cm$^{-3}$ to an order of $10^{18}$ cm$^{-3}$, and there is an order of $10^{19}$ cm$^{-3}$ at the interface of the second semiconductor layer 104 and the diffusion barrier layer. The diffusion coefficient of the third dopant in the diffusion barrier layer is in the range of $10^{-14}$ cm$^2$/s and $10^{-16}$ cm$^2$/s, and the diffusion coefficient of the third dopant in the diffusion barrier layer is smaller than the diffusion coefficient of the third dopant in the light-absorbing layer 102.

In an embodiment, the substrate 100 has a conductivity-type same with that of the first semiconductor layer 101, such as first conductivity-type. The substrate 100 is an epitaxial substrate which can be used to grow the first semiconductor layer 101, the light-absorbing layer 102, the diffusion barrier layer 103, the second semiconductor layer 104, the interlayer 105 and/or the semiconductor contact layer 106 by metal organic chemical vapor deposition (MOCVD) method. In an embodiment, the substrate 100, the first semiconductor layer 101, the light-absorbing layer 102, the diffusion barrier layer 103, the second semiconductor layer 104, the interlayer 105, and the semiconductor contact layer 106 are lattice-matched to each other, wherein "lattice-matched" refers to the ratio of the difference between the lattice constants of two adjacent layers to the average of the lattice constants of two adjacent layers is smaller than or equal to 0.1%. In an embodiment, the substrate 100, the first semiconductor 101, the light-absorbing layer 102, the diffusion barrier layer 103, the second semiconductor layer 104, the interlayer 105, and the semiconductor contact layer 106 all include III-V compound semiconductors such as AlInGaAs series and/or AlGaInP series. AlInGaAs represents $(Al_{x1}In_{(1-x1)})_{1-x2}Ga_{x2}As$, wherein $0 \le x_1 \le 1$ and $0 \le x_2 \le 1$, and AlInGaP represents $(Al_{y1}In_{(1-y1)})_{1-y2}Ga_{y2}P$, wherein $0 \le y_1 \le 1$ and $0 \le y_2 \le 1$. In an embodiment, the substrate 100, the first semiconductor 101, the light-absorbing layer 102, the diffusion barrier layer 103, the second semiconductor layer 104, the interlayer 105, or the semiconductor contact layer 106 may include a binary or ternary III-V compound semiconductor. In an embodiment, the first conductivity-type is n-type and the second conductivity-type is p-type. In an embodiment, the first dopant, the second dopant, or the third dopant may be magnesium (Mg), zinc (Zn), silicon (Si), or tellurium (Te). In an embodiment, the first dopant and the second dopant both include Si, and the third dopant includes Zn. In an embodiment, the substrate 100 includes n-type InP. In an embodiment, the first semiconductor layer 101 includes n-type InP. In an embodiment, the fifth region 102a and the eighth region 102c of the light-absorbing layer 102 includes p-type InGaAs. In an embodiment, the sixth region 102b of the light-absorbing layer 102 includes unintentionally-doped InGaAs. In an embodiment, the third region 103a and the ninth region of the diffusion barrier layer 103 includes p-type InAlAs. In an embodiment, the fourth region 103b of the diffusion barrier layer 103 includes n-type InAlAs. In an embodiment, the first region 104a and the seventh region 104c of the second semiconductor 104 includes p-type InP. In an embodiment, the second region 104b of the second semiconductor 104 includes n-type InP. In an embodiment, the interlayer 105 includes unintentionally-doped InP. In an embodiment, the semiconductor contact layer 106 includes p-type InGaAs.

The first electrode structure 108 and the second electrode structure 110 can include a single-layered or multilayered metal structure. The first electrode structure 108 and the second electrode structure 110 respectively include Ni, Ti, Pt, Pd, Ag, Au, Al, or Cu. The first electrode structure 108 and the second electrode structure 110 can be used as welding pads to connect to an external device or a circuit.

The insulating layer 107 and the antireflection layer 109 respectively include dielectric material, such as tantalum oxide ($TaO_x$), aluminum oxide ($AlO_x$), silicon oxide ($SiO_x$), titanium oxide ($TiO_x$), silicon nitride ($SiN_x$), niobium oxide ($Nb_2O_5$) or spin-on-glass (SOG). In an embodiment, the antireflection layer 109 includes a multilayered structure with a gradient refractive index formed by different materials or compositions. For example, the antireflection layer 109 can be constituted by alternately-stacked high refractive index material and low refractive index material to facilitate external light entering into the photo-detecting device 10.

Figure 4:
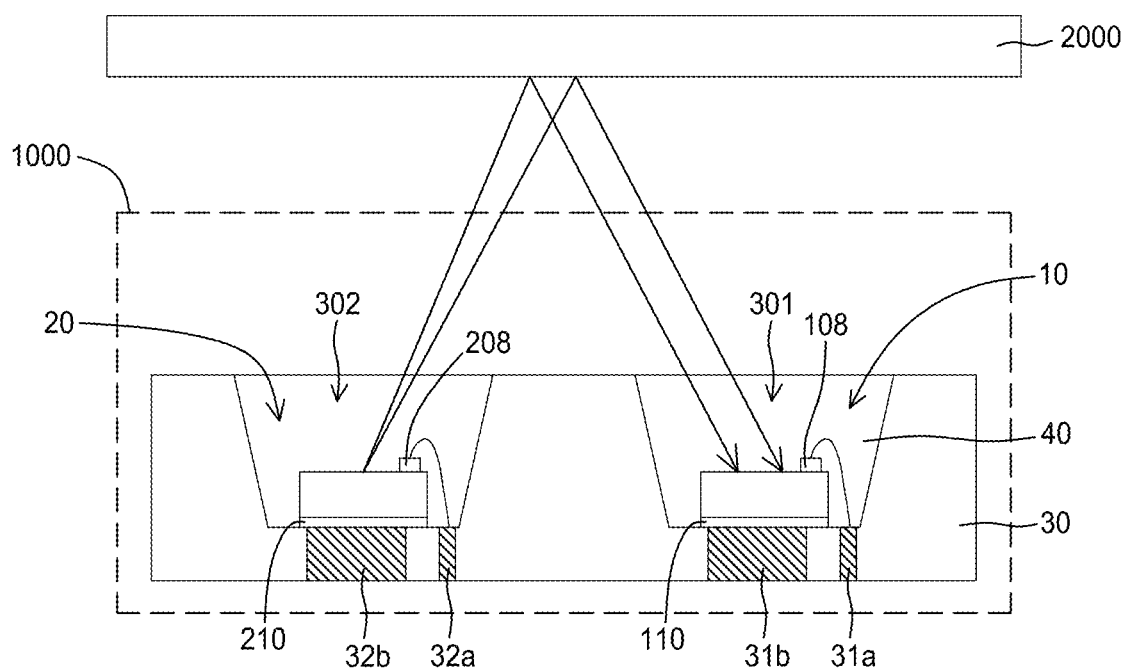
FIG. 4 shows a schematic view of a photo-detecting module in accordance with an embodiment of the present disclosure.

FIG. 4 shows a photo-detecting module and the application thereof in accordance with the present disclosure. The photo-detecting module 1000 includes a carrier 30, a photo-detecting device 10 located in a first trench 301 of the carrier 30, a light-emitting device 20 located in a second trench 302 of the carrier 30, a transparent encapsulation structure 40 encapsulates the photo-detecting device 10 and the light-emitting device 20 which are in the trenches 301, 302. The photo-detecting device 10 in the aforementioned embodiments includes the electrode structures 108, 110. The light-emitting device 20 includes the electrode structures 208, 210, and further includes an active layer capable of emitting light, e.g. infrared light, with a peak wavelength in a range of 800 nm to 2000 nm (such as 810 nm, 850 nm, 910 nm, 940 nm, 1050 nm, 1070 nm, 1100 nm, 1200 nm, 1300 nm, 1400 nm, 1450 nm, 1500 nm, 1550 nm, 1600 nm, 1650 nm, or 1700 nm) to be absorbed by the photo-detecting device 10. The light-emitting device 20 and the photo-detecting device 10 can have the same material series, for example, the light-emitting device 20 and the photo-detecting device 10 both include AlInGaAs series or/and AlGaInP series. The carrier 30 includes first circuit structures 31a, 31b electrically connected to the electrode structures 108, 110 of the photo-detecting device 10 respectively to receive electrical signals (such as current or voltage) generated by the photo-detecting device 10. The carrier 30 includes second circuit structures 32a, 32b electrically connected to the electrode structures 208, 210 of the light-emitting device 20 respectively to drive the light-emitting device 20 to emit the light with a specific wavelength, e.g. infrared light with a peak-wavelength in a range of 800 nm to 2000 nm. The photo-detecting module 1000 is used as a proximity sensor and can be applied to a mobile device. As shown in FIG. 4, when the mobile device including the photo-detecting module 1000 approaches an object 2000, the light with the specific wavelength emitted by the light-emitting device 20 is reflected by the object 2000 to the photo-detecting device 10 and further absorbed by the photo-detecting device 10, and an electrical signal is generated by the photo-detecting device 10 for sensing the existence of the object 2000 and triggering an action, e.g. turning on or off the screen of the mobile device accordingly. The carrier 30 can be a package submount or a printed circuit board (PCB). The electrode structures 108, 110, 208, 210, the first circuit structures 31a, 31b, and the second circuit structures 32a, 32b can include a single-layered or multilayered structure and comprise Ni, Ti, Pt, Pd, Ag, Au, Al or Cu. The transparent packaging structure 40 can include an organic polymer or inorganic dielectric material, for example, epoxy or silicon.

Based on the above, the photo-detecting device provided in the present disclosure may exhibit improved optical-electrical characteristics, such as low dark current (for example, <1 nA). Specifically, the semiconductor device of the present disclosure can be applied to products in various fields, such as lighting control, medical care, communication, or other sensing/detecting system. For example, the semiconductor device can be used in a mobile phone, tablet, wearable device (such as a watch, bracelet, or necklace), or medical device.

It should be realized that each of the embodiments mentioned in the present disclosure is only used for describing the present disclosure, but not for limiting the scope of the present disclosure. Any obvious modification or alteration is not departing from the spirit and scope of the present disclosure. Furthermore, the above-mentioned embodiments can be combined or substituted under the proper condition and are not limited to specific embodiments described above. A connection relationship between a specific component and another component specifically described in an embodiment may also be applied in another embodiment and is within the scope as claimed in the present disclosure.

What is claimed is:

1. A photo-detecting device, comprising:
    a first semiconductor layer having a first conductivity-type;
    a second semiconductor layer located on the first semiconductor layer and comprising a first region having a second conductivity-type and a second region having the first conductivity-type, wherein the first region is surrounded by the second region and has a geometric center and a perimeter, and the first conductivity-type is different from the second conductivity-type;
    a light-absorbing layer located between the first semiconductor layer and the second semiconductor layer;
    an insulating layer covering the first region and the second region;
    an electrode structure located on the insulating layer and comprising an outer sidewall located on the second region;
    wherein in a top view, the perimeter of the first region is located between the geometric center and the outer sidewall.

2. The photo-detecting device of claim 1, wherein the insulating layer comprises a first opening to expose the first region.

3. The photo-detecting device of claim 2, wherein the first opening has a width smaller than that of the first region.

4. The photo-detecting device of claim 2, wherein the electrode structure comprises a second opening corresponding to the first opening to expose the first region.

5. The photo-detecting device of claim 4, wherein the second opening has a width smaller than that of the first opening.

6. The photo-detecting device of claim 1, wherein the electrode structure comprises a first portion contacting the first region and a second portion contacting the insulating layer.

7. The photo-detecting device of claim 6, wherein the first portion has a width in a range of 1 μm to 50 μm.

8. The photo-detecting device of claim 1, wherein the electrode structure comprises an inner side wall located on the first region, and in the top view, the perimeter is located between the inner sidewall and the outer sidewall.

9. The photo-detecting device of claim 1, wherein the first region comprises a first dopant and a second dopant different from the first dopant, and the second region comprises the second dopant without the first dopant.

10. The photo-detecting device of claim 9, wherein the first dopant in the first region has a first concentration, and the second dopant in the first region has a second concentration smaller than the first concentration.

11. The photo-detecting device of claim 9, wherein the light-absorbing layer comprises a third region having the first dopant.

12. The photo-detecting device of claim 11, wherein the first region and the third region have a depth in a vertical direction, and the depth is in a range of 2 µm to 4 µm.

13. The photo-detecting device of claim 11, wherein the third region has a thickness in a range of 0.1 µm to 1 µm.

14. The photo-detecting device of claim 1, wherein the light-absorbing layer has a thickness in a range of 1 µm to 5 µm.

15. The photo-detecting device of claim 1, wherein the second semiconductor layer has a thickness smaller than that of the light-absorbing layer.

16. The photo-detecting device of claim 1, wherein the electrode structure comprises an electrode pad and an extension electrode extending from the electrode pad, in a horizontal direction the extension electrode a width in a range of 10 µm to 50 µm.

17. The photo-detecting device of claim 16, wherein in the top view, the extension electrode covers the first region, the second region and the perimeter.

18. The photo-detecting device of claim 1, further comprising an antireflection layer covering the first region and the insulating layer.

19. A photo-detecting module, comprising:
   a light-emitting device;
   the photo-detecting device of claim 1; and
   a carrier electrically connecting to the light-emitting device and the photo-detecting device.

20. The photo-detecting device of claim 19, wherein the carrier comprises a first trench and a second trench, and the light-emitting device and the photo-detecting device are disposed in the first trench and the second trench respectively.

* * * * *